United States Patent
Ng et al.

(10) Patent No.: US 10,800,168 B2
(45) Date of Patent: Oct. 13, 2020

(54) INPUT CONTROL SIGNALS PROPAGATED OVER SIGNAL PATHS

(71) Applicant: HEWLETT-PACKARD DEVELOPMENT COMPANY, L.P., Spring, TX (US)

(72) Inventors: Boon Bing Ng, Vancouver, WA (US); Hang Ru Goy, Singapore (SG)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/337,837

(22) PCT Filed: Oct. 6, 2016

(86) PCT No.: PCT/US2016/055701
§ 371 (c)(1),
(2) Date: Mar. 28, 2019

(87) PCT Pub. No.: WO2018/067155
PCT Pub. Date: Apr. 12, 2018

(65) Prior Publication Data
US 2020/0031116 A1    Jan. 30, 2020

(51) Int. Cl.
*B41J 2/045* (2006.01)
*B41J 2/175* (2006.01)
(Continued)

(52) U.S. Cl.
CPC ......... *B41J 2/04541* (2013.01); *B41J 2/0458* (2013.01); *B41J 2/04543* (2013.01);
(Continued)

(58) Field of Classification Search
CPC .................. B41J 2/04543; B41J 2/04545
See application file for complete search history.

(56) References Cited

U.S. PATENT DOCUMENTS 5,327,165 A    7/1994    Elliott
6,022,094 A *  2/2000    Gibson .................. B41J 25/34
                                                    347/19

(Continued)

FOREIGN PATENT DOCUMENTS

CN    101274531    10/2008
CN    103042830    4/2013
(Continued)

OTHER PUBLICATIONS

Nova PH 256/80 AAA, https://www.fujifilmusa.com/shared/bin/PDS00031.pdf, Jan. 15, 2015 (2 pages).

*Primary Examiner* — Shelby L Fidler
(74) *Attorney, Agent, or Firm* — Trop Pruner & Hu PC

(57) ABSTRACT

In some examples, a control apparatus for a fluid ejection device includes a plurality of selectors controllable by an input control signal to produce signals for selecting respective nozzles of the fluid ejection device, where a first selector is responsive to the input control signal propagated over a first signal path to turn on a device in the first selector, and a second selector is responsive to the input control signal to perform a different task. A memory encoder is to select a memory location in the memory, the memory encoder responsive to the input control signal propagated over a second signal path to turn on a device in the memory encoder, where signal loading of the second signal path is isolated from signal loading of the first signal path.

14 Claims, 8 Drawing Sheets

(51) Int. Cl.
 *G11C 11/4094* (2006.01)
 *G11C 7/12* (2006.01)

(52) U.S. Cl.
 CPC .............. *B41J 2/1753* (2013.01); *G11C 7/12* (2013.01); *G11C 11/4094* (2013.01)

(56) References Cited

U.S. PATENT DOCUMENTS

| | | | |
|---|---|---|---|
| 6,183,056 | B1 | 2/2001 | Corrigan et al. |
| 6,371,588 | B1 * | 4/2002 | Tsuruoka ............. B41J 2/04505 347/12 |
| 6,435,668 | B1 | 8/2002 | Barbour et al. |
| 6,467,883 | B1 * | 10/2002 | Sakurai ................ B41J 2/04541 347/56 |
| 6,491,377 | B1 | 12/2002 | Cleland et al. |
| 6,575,548 | B1 | 6/2003 | Corrigan et al. |
| 7,278,703 | B2 | 10/2007 | Benjamin |
| 7,543,906 | B2 | 6/2009 | Benjamin et al. |
| 8,109,586 | B2 | 2/2012 | Benjamin |
| 8,474,943 | B2 | 7/2013 | Ness |
| 8,511,796 | B2 * | 8/2013 | Ghozeil ............... B41J 2/04543 347/12 |
| 2002/0015077 | A1 | 2/2002 | Eckard |
| 2007/0097178 | A1 | 5/2007 | Benjamin et al. |
| 2010/0302293 | A1 * | 12/2010 | Torgerson ............ B41J 2/04501 347/10 |
| 2016/0241237 | A1 | 8/2016 | Otsuka et al. |

FOREIGN PATENT DOCUMENTS

| | | |
|---|---|---|
| CN | 104057707 | 9/2014 |
| EP | 0953446 | 11/1999 |
| EP | 1029675 | 8/2000 |
| JP | 58101081 | 6/1983 |
| JP | H03134700 | 6/1991 |
| JP | 11192702 | 7/1999 |
| JP | 2000238247 | 9/2000 |
| WO | WO-2013146246 | 10/2013 |
| WO | WO-20150116129 | 8/2015 |

\* cited by examiner

INPUT CONTROL SIGNALS PROPAGATED OVER SIGNAL PATHS

BACKGROUND

A printing system can include a printhead that has nozzles to dispense printing fluid to a target. In a two-dimensional (2D) printing system, the target is a print medium, such as a paper or another type of substrate onto which print images can be formed. Examples of 2D printing systems include inkjet printing systems that are able to dispense droplets of inks. In a three-dimensional (3D) printing system, the target can be a layer or multiple layers of build material deposited to form a 3D object.

BRIEF DESCRIPTION OF THE DRAWINGS

Some implementations of the present disclosure are described with respect to the following figures.

DETAILED DESCRIPTION

Figure 1:
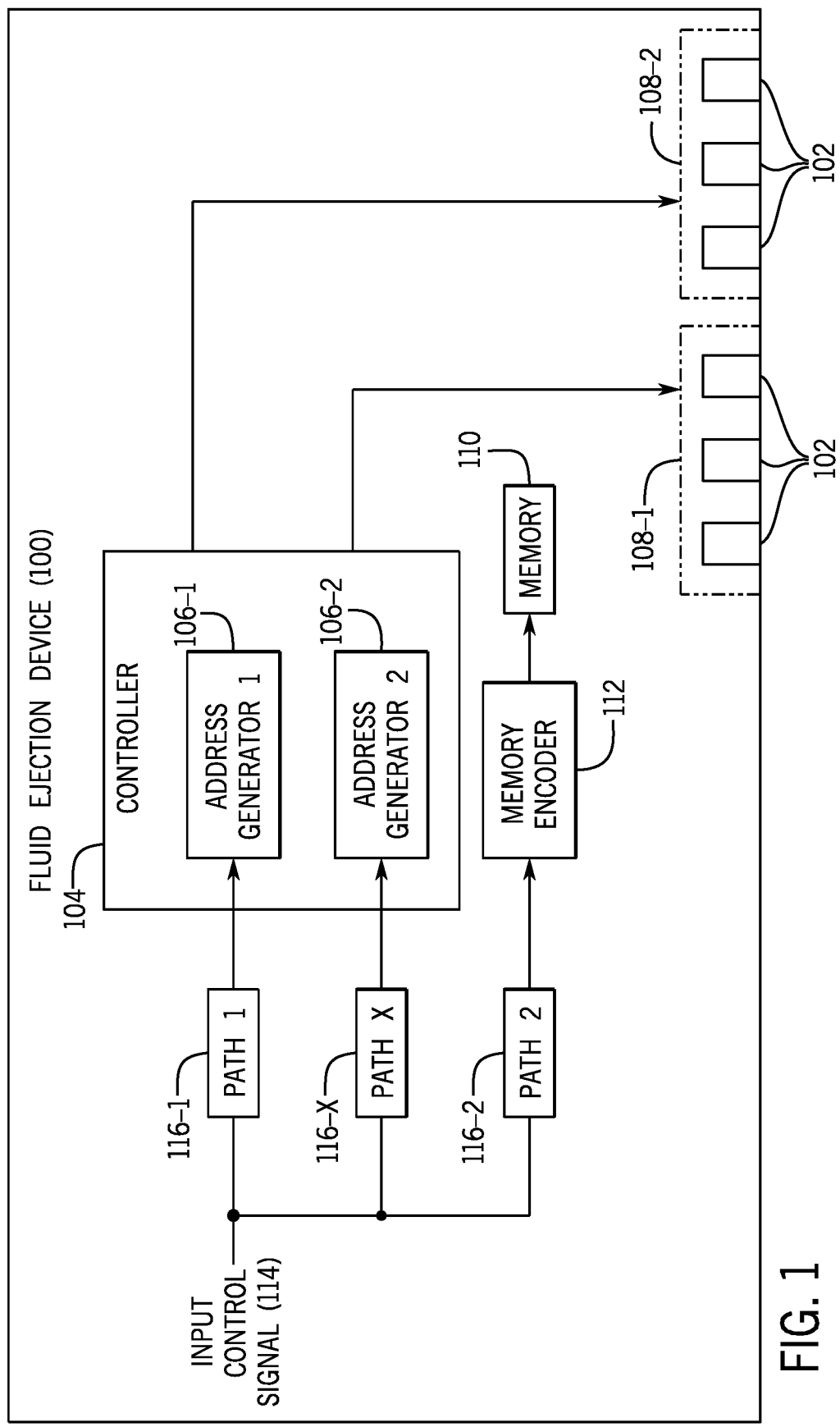
FIG. 1 is a block diagram of a fluid ejection device according to some examples.

In the present disclosure, the article "a," "an", or "the" can be used to refer to a singular element, or alternatively to multiple elements unless the context clearly indicates otherwise. Also, the term "includes," "including," "comprises," "comprising," "have," or "having" is open ended and specifies the presence of the stated element(s), but does not preclude the presence or addition of other elements.

A printhead for use in a printing system can include nozzles that are activated to cause printing fluid droplets to be ejected from respective nozzles. Each nozzle includes a heating element that when activated generates heat to vaporize a printing fluid in a firing chamber of the nozzle, which causes expulsion of a droplet of the printing fluid from the nozzle. A printing system can be a two-dimensional (2D) or three-dimensional (3D) printing system. A 2D printing system dispenses printing fluid, such as ink, to form images on print media, such as paper media or other types of print media. A 3D printing system forms a 3D object by depositing successive layers of build material. Printing fluids dispensed from the 3D printing system can include ink, as well as fluids used to fuse powders of a layer of build material, detail a layer of build material (such as by defining edges or shapes of the layer of build material), and so forth.

In the ensuing discussion, the term "printhead" can refer generally to a printhead die or an overall assembly that includes multiple printhead dies mounted on a support structure. Although reference is made to a printhead for use in a printing system in some examples, it is noted that techniques or mechanisms of the present disclosure are applicable to other types of fluid ejection devices used in non-printing applications that are able to dispense fluids through nozzles. Examples of such other types of fluid ejection devices include those used in fluid sensing systems, medical systems, vehicles, fluid flow control systems, and so forth.

A printhead can include selectors that are used to select nozzles for activation. An activated nozzle is able to eject a printing fluid. In some implementations, the selectors include address generators that generate addresses that specify which of the nozzles are to be activated. Nozzles not selected by the generated addresses remain inactive, and thus do not eject printing fluid. In other examples, selectors can generate other signals for selecting nozzles to be activated.

Some example printheads also include memories. A memory in a printhead can be used to store certain information, such as an identifier associated with the printhead, a serial number, security information, and so forth. The printhead can further include a memory encoder that is used to select a memory location of the memory, where the selected memory location can be read from or written to. In some examples, the memory encoder includes shift registers that receive a serial input and provide a parallel output of multiple signals that are used to select a memory location (or multiple memory locations) of the memory in the printhead. The input to a shift register of the memory encoder can include a memory access signal that is used to access a memory location of a memory.

Input control signals can be provided to the printhead to perform various tasks. At higher frequencies of operation, an input control signal may be sensitive to signal loading of the input control signal. Signal loading is based on a number of devices, such as transistors, that the input control signal is connected to. For example, if the input control signal is used to turn on a large number of transistors, then the signal loading experienced by the input control signal is increased. Increased signal loading can result in low-to-high or high-to-low transitions of the input control signal being missed, especially transitions of the input control signal at a higher frequency. Missing transitions of the input control signal can lead to errors in the operation of certain circuitry of the printhead, such as address generators and memory encoders for a memory. For example, heavy signal loading of the input control signal can result in certain nozzles not being activated when they should have been, which can lead to sub-optimal printed images (such as in the form of blank areas in printed images).

In accordance with some implementations of the present disclosure, signal path isolation is employed to isolate a first signal path over which an input control signal is propagated to a first selector (e.g., a first address generator) that is used for selecting nozzle(s) for activation, from a second signal path over which the input control signal is propagated to a memory encoder that is used for selecting memory location (s) of a memory. The input control signal is also provided to a second selector (e.g., a second address generator) for selecting nozzle(s) for activation. Because the input control signal causes different tasks to be performed at the first and second selectors, the first selector may be more sensitive to signal loading of the input control signal than the second selector. Note that the first selector and the second selector can be used to select different subsets of nozzles for activation. For example, the first selector can be used to select nozzles in a first region of a fluid ejection device (e.g., a printhead or other type of fluid ejection device), while the second selector can be used to select nozzles in a second region of the fluid ejection device, where the second region is distinct from the first region. The different regions can be separate physical regions, or separate logical regions of the fluid ejection device.

Although reference is made to first and second selectors for selecting nozzles for activation, it is noted that in other examples, more than two selectors can be provided in a fluid ejection device.

FIG. 1 illustrates an example of a fluid ejection device 100, which can be a printhead used in a printing system (e.g., a 2D or 3D printing system), or a fluid ejection device used in a non-printing system. A fluid ejection device can be implemented as an integrated circuit (IC) die that includes a substrate on which is provided nozzles and control circuitry to control ejection of a fluid by the nozzles. For a printing system, the die can be a printhead die, which can be mounted or attached to a carriage of the printing system, or which can be mounted or attached to a printing fluid cartridge.

The fluid ejection device 100 includes nozzles 102 and a controller 104 to control activation of the nozzles 102. As used here, the term "controller" can refer to any or some combination of the following: a microprocessor, a core of a multi-core microprocessor, a microcontroller, a programmable gate array, a programmable integrated circuit device, or any other hardware processing circuit. In further examples, a "controller" can refer to a combination of a hardware processing circuit and machine-readable instructions executable on the hardware processing circuit.

The controller 104 includes a first address generator 106-1 and a second address generator 106-2. Each address generator 106-1 or 106-2 is to generate an address that is to be used for selecting a nozzle (or nozzles) for activation. The first address generator 106-1 is used to control activation of nozzles 102 in a first group 108-1 of nozzles, and the second address generator 106-2 is to control activation of nozzles 102 in a second group 108-2 of nozzles. Although two address generators and two respective groups of nozzles are shown in FIG. 1, it is noted that in other examples, the controller 104 can include more than two address generators for controlling more than two groups of nozzles. Also, more generally, the address generators 106-1 and 106-2 can be referred to as selectors.

Although not shown, the controller 104 can further include firing circuits to control activation of respective nozzles. In some examples, there is one firing circuit per nozzle. In different examples, there can be one firing circuit for multiple nozzles. A firing circuit can also be referred to as a firing cell. The firing circuit includes a heating element, such as a firing resistor, that when activated produces heat to eject fluid from a firing chamber of a nozzle. The address generated by an address generator 106-1 or 106-2 is provided to the firing circuit. The address controls which of the firing circuits is selected, which correspondingly controls which of the nozzles 102 is activated.

The fluid ejection device 100 further includes a memory 110 and a memory encoder 112 that controls a selection of memory locations in the memory 110 to access (as part of performing a read or a write). The memory encoder 112 and the memory 110 can be implemented as part of a memory device, such as a memory die, or alternatively, the memory encoder 112 and the memory 110 can be implemented as separate components.

The memory 110 can be a non-volatile memory, such as an erasable programmable read only memory (EPROM), a flash memory, or any other type of non-volatile memory. In other examples, the memory 110 can be a volatile memory, such as a dynamic random access memory (DRAM), a static random access memory (SRAM), or any other type of volatile memory.

The memory encoder 112 receives input signals, and based on the input signals, the memory encoder 112 produces memory select signals for selecting a memory location (or memory locations) in the memory 110 for access. Similarly, the address generators 106-1 and 106-2 produce addresses in response to input signals.

One of the input signals shared by the memory encoder 112 and the address generators 106-1 and 106-2 is an input control signal 114. Although reference is made to one input control signal as being shared by the memory encoder 112 and the address generators 106-1 and 106-2, it is noted that in other examples, multiple input control signals can be shared by the memory encoder 112 and the address generators 106-1 and 106-2.

Heavy loading of an input control signal in a fluid ejection device can cause errors in operation of the fluid ejection device, especially at higher frequencies of operation. In accordance with some implementations of the present disclosure, signal paths over which the input control signal 114 is provided to respective different control circuits can be isolated from one another, to reduce or eliminate signal loading effects. In examples according to FIG. 1, the input control signal 114 is provided over a first signal path 116-1 to the first address generator 106-1. The input control signal 114 is provided over a second signal path 116-2 to the memory encoder 112. Signal loading of the first signal path 116-1 is isolated from signal loading of the second signal path 116-2. The signal loading of first and second signal paths is isolated from one another if a source that is used to drive a signal transition (low-to-high or high-to-low) of a signal over the first and second signal paths are different.

The memory encoder 112 is responsive to the input control signal 114 propagated over the second signal path 116-2 to turn on devices (such as transistors) in the memory encoder 112. In the present disclosure, turning on a device (e.g., a transistor) refers to switching the device from an off state to an on state. Similarly, the first address generator 106-1 is responsive to the input control signal 114 propagated over the first signal path 106-1 to turn on devices (such as transistors) in the first address generator 106-1. Since there may be a relatively large number of devices to turn on in the first address generator 106-1 and the memory encoder 112, the input control signal 114 would be subjected to heavy loading if the separate signal paths 116-1 and 116-2 were not provided to provide signal loading isolation.

Moreover, the input control signal 114 is used to turn on devices in the first address generator 106-1 and in the memory encoder 112 at substantially the same time, which would further exacerbate the effects of heavy loading of the input control signal 114. Turning on devices at "substantially the same time" can refer to turning on devices at the same time or within a specified time range of one another.

The second address generator 106-2 is responsive to the input control signal 114 propagated over a signal path 116-X to perform a task in the first address generator 106-2 that is different from the task responsive to the input control signal 114 in the first address generator 106-1 and in the memory encoder 112. The signal path 116-X can be the same as the signal path 116-2, or alternatively, the signal path 116-X can be different from the signal path 116-2, such that the signal loading of the signal path 116-X is isolated from the signal loading of the signal path 116-2. The input control signal 114 provided to the second address generator 106-2 and the memory encoder 112 can share a common signal path because the number of devices in the second address generator 106-2 and the memory encoder 112 to which the input control signal 114 is connected would not cause excessive loading.

In some examples, the task performed in the second address generator 106-2 in response to the input control signal 114 can include pre-charging nodes in the second address generator 106-2. Pre-charging a node can refer to charging the node to a specified voltage. Generally, pre-charging a node is less sensitive to signal loading effects than the turning on of a device, which relies on high-speed operation at high frequencies.

In other examples, the task performed in the second address generator 106-2 in response to the input control signal 114 includes turning on devices (such as transistors) in the second address generator 106-2 at a different time than turning on devices in the first address generator 106-1 or the memory encoder 112. Turning on a device according to a signal timing can refer to turning on the device based on a signal that transitions (low-to-high and high-to-low transitions) at specified times. More generally, the second address generator 106-2 can perform a task in response to the input control signal 114 according to different timing than a task performed by the first address generator 106-1.

Figure 2:
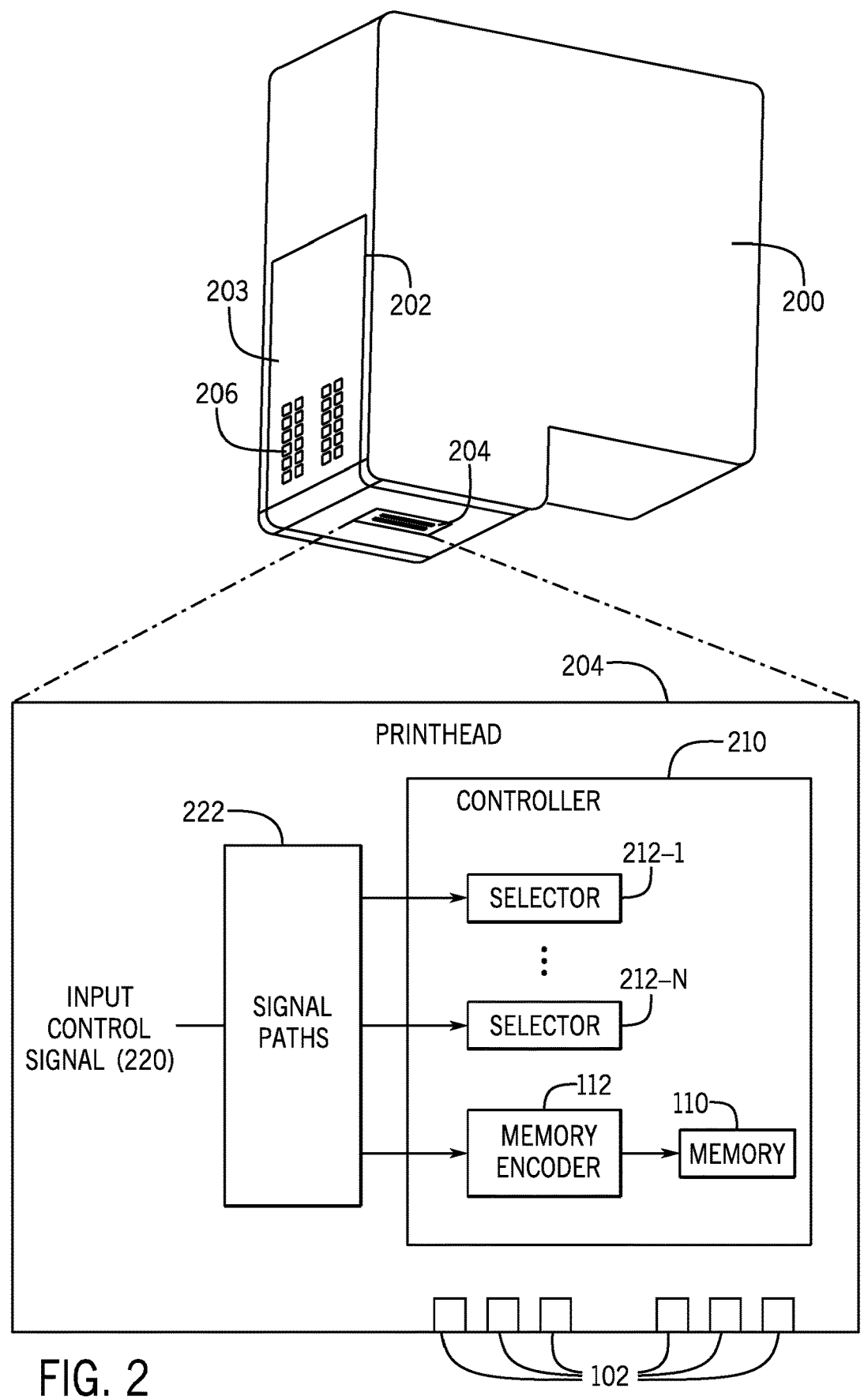
FIG. 2 is a block diagram of a printing fluid cartridge including a printhead according to some examples.

FIG. 2 is a block diagram of an example printing fluid cartridge 200 (such as an ink cartridge), for use in a 2D printing system or a 3D printing system. Although a printing fluid cartridge is shown, it is noted that components depicted in FIG. 2 can be modified for inclusion in non-printing applications.

A tab head assembly 202 can be attached to a surface (or surfaces) of the printing fluid cartridge 200. The tab head assembly 202 includes a flexible cable 203 on which can be provided a printhead 204 (which in examples according to FIG. 2 is a printhead die), electrically conductive pads 206, and other component(s) (not shown). In further examples, multiple printhead dies can be provided as part of the tab head assembly 202. In FIG. 2, the printhead 204 is an example of the fluid ejection device 100 shown in FIG. 1. The flexible cable 203 includes electrically conductors to electrically connect components of the tab head assembly 202, including the printhead 204, the electrically conductive pads 206, and other component(s).

FIG. 2 shows an example of an integrated printhead that is part of the printing fluid cartridge 200. With an integrated printhead, a printhead die is attached to the printing fluid cartridge 200. The printing fluid cartridge 200 is removably mounted in a printing system; for example, the printing fluid cartridge can be removed from the printing system and replaced with a new printing fluid cartridge. When the printing fluid cartridge 200 is installed in a cradle or other receptacle in a carriage of a printing system, the electrically conductive pads 206 make electrical contact with corresponding electrical structures of the carriage, so that the printing system can communicate with and control operations of the printing fluid cartridge 200, including the printhead 204.

The printhead 204 includes a controller 210, which includes multiple selectors 212-1 to 212-N (N≥2). The selectors 212-1 to 212-N are used to select respective nozzles 102 of the printhead 204 for activation. In some examples, the selectors 212-1 and 212-N can be address generators, such as address generators 106-1 and 106-2 depicted in FIG. 1.

The controller 210 also includes a memory 110 and a memory encoder 112 as discussed above. Also, signal loading isolation for an input control signal 220 can be achieved by providing separate signal paths 222 over which the input control signal 220 is propagated to the selectors 212-1 and 212-N and the memory encoder 112. The separate signal paths 222 can be similar to the signal paths 116-1, 116-X, and 116-2 of FIG. 1.

In other examples, the printhead 204 can be mounted to a carriage of a printing system, such as a 2D or 3D printing system.

FIGS. 3A-3D depict examples of separate signal paths that can be employed. In each of FIGS. 3A, 3C, and 3D, it is assumed that two input control signals, S2 and S4, are shared among the selector 212-1, the selector 212-N, and the memory encoder 112. In other examples, more input control signals can be shared by the selector 212-1, the selector 212-N, and the memory encoder 112.

Figure 3A:
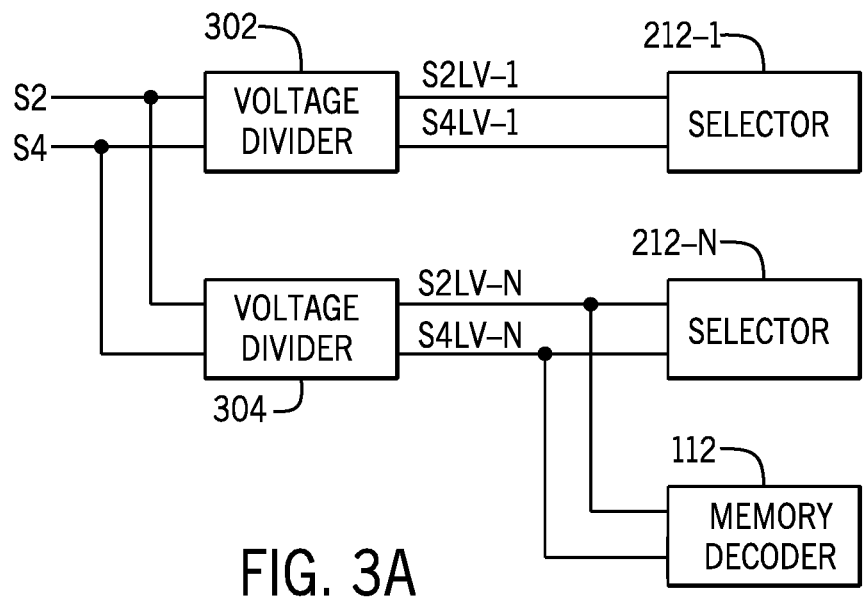
FIGS. 3A-3D are block diagrams of arrangements that use voltage dividers to provide separate signal paths, according to some examples.

In FIG. 3A, two separate signal paths include a first signal path that includes a first voltage divider circuit 302, and a second signal path that includes a second voltage divider circuit 304. Each voltage divider circuit 302 or 304 includes a voltage divider for the input control signal S2, and another voltage divider for the input control signal S4.

Figure 3B:
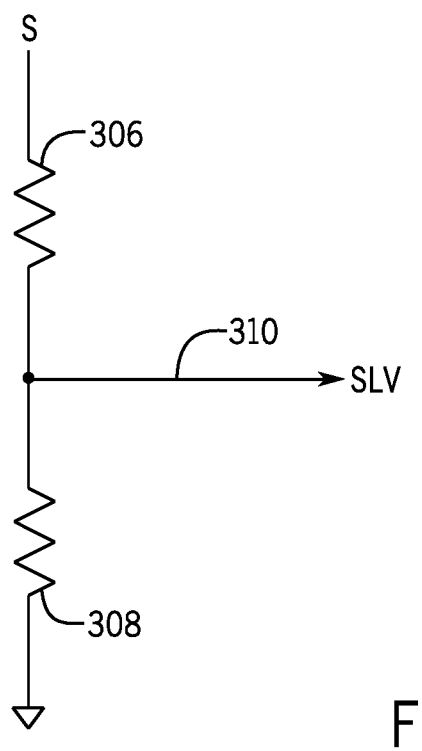

An example of a voltage divider is shown in FIG. 3B, where the voltage divider includes resistors 306 and 308 arranged in series between an input control signal S (e.g., S2 or S4) and a reference voltage (e.g., ground). A node between the resistors 306 and 308 provides a lower voltage version, SLV, of the input control signal S. The voltage level of SLV is based on the voltage level of S multiplied by the ratio of the resistance of the resistor 306 to the resistance of the resistor 308.

In each voltage divider circuit 302 or 304 in FIG. 3A, two of the voltage dividers shown in FIG. 3B can be provided, one for S2 and one for S4. The voltage divider circuit 302 produces S2LV-1 from S2 (where S2LV-1 is a lower voltage version S2), and S4LV-1 from S4 (where S4LV-1 is a lower voltage version S4). The voltage divider circuit 304 produces S2LV-N from S2 (where S2LV-N is a lower voltage version S2), and S4LV-N from S4 (where S4LV-N is a lower voltage version S4).

In FIG. 3A, each of input control signals S2 and S4 is provided over a first signal path (which includes the voltage divider circuit 302) to the selector 212-1. The output signals S2LV-1 and S4LV-1 from the voltage divider circuit 302 are provided to the selector 212-1.

Each of input control signals S2 and S4 is provided over a second signal path (which includes the voltage divider circuit 304) to the selector 212-N and the memory decoder 112. The output signals S2LV-N and S4LV-N from the voltage divider circuit 302 are provided to the selector 212-N and the memory decoder 112. In some examples, the signal S2LV-1 is used to turn on transistors in the selector 212-1, and the signal S2LV-N is to turn on transistors in the memory decoder 112. The signal S2LV-N is to cause the selector 212-N to perform a task that is different from the task performed in the selector 212-1 in response to the signal S2LV-1.

Figure 3C:
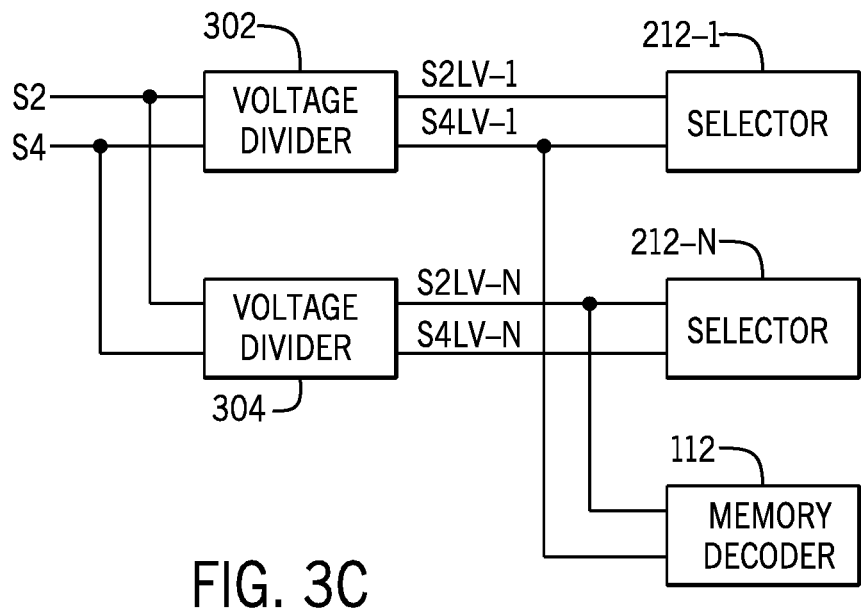

FIG. 3C shows a variation of the arrangement shown in FIG. 3A. In FIG. 3C, the input control signal S2 is propagated over the first signal path (including the voltage divider circuit 302) to the selector 212-1, and over the second signal path (including the voltage divider circuit 304) to the selector 212-N and the memory decoder 112. The input control signal S4 is propagated over the first signal path (including the voltage divider circuit 302) to the selector 212-1 and the memory decoder 112, and the input control signal S4 is propagated over the second signal path (including the voltage divider circuit 304) to the selector 212-N.

Figure 3D:
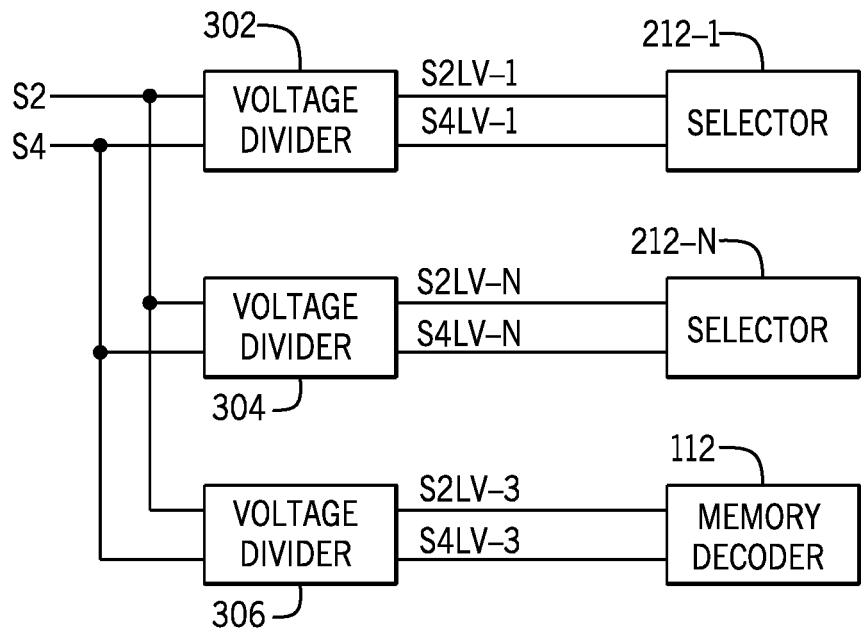

FIG. 3D depicts another example arrangement, which includes another voltage divider circuit 306 in addition to the voltage divider circuits 302 and 304. In FIG. 3D, the input control signals S2 and S4 are provided over three signal paths (including voltage dividers 302, 304, and 306, respectively) to the selector 212-1, 212-N, and memory decoder 112, respectively. In other words, in FIG. 3D, each signal S2 or S4 is propagated over a respective separate signal path to each of the selector 212-1, the selector 212-N and the memory decoder 112.

In further examples, instead of using different voltage dividers to provide separate signal paths, other circuitry can be used instead. For example, multiple signal drivers can be used, where each signal driver outputs a different instances of an input control signal. As yet another example, multiple bond pads can be used to provide different instances of an input control signal.

Figure 4:
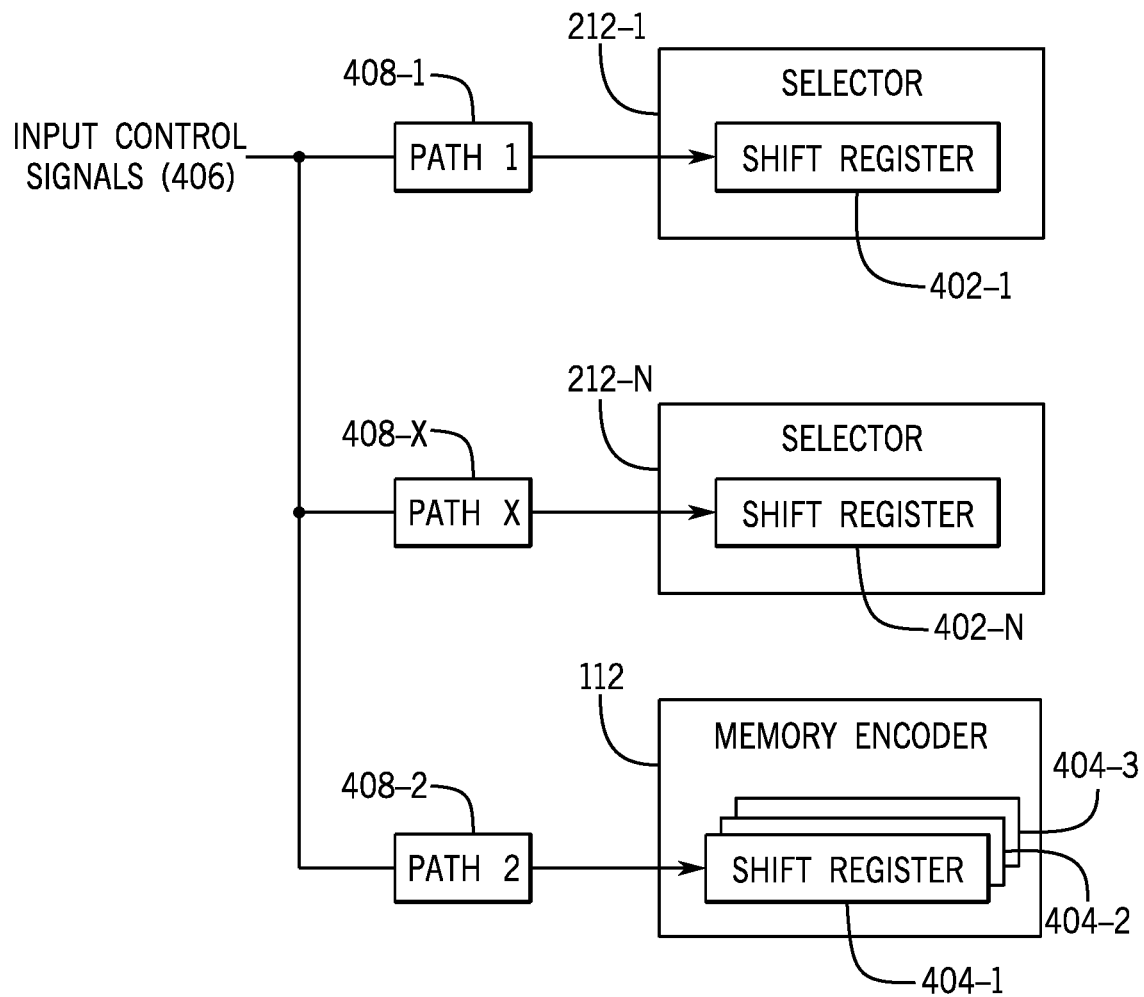
FIG. 4 is a block diagram of an arrangement that includes selectors and a memory encoder including shift registers, according to some examples.

FIG. 4 is a block diagram of a specific example arrangement that can be used in the controller 104 or the controller 210 discussed above. In FIG. 4, each of the selectors 212-1 and 212-N and the memory decoder 112 includes a shift register that is used to shift input signals to output signals. The selector 212-1 includes a shift register 402-1, the selector 212-N includes a shift register 402-N, and the memory encoder 112 includes shift registers 404-1, 404-2, and 404-3. Although specific numbers of shift registers are shown as included in each of the selector 212-1, 212-N, and the memory encoder 112, in other examples, different numbers of shift registers can be employed. Note also that each of the selector 212-1, 212-N, and the memory encoder 112 can include further circuitry in addition to the respective shift register(s).

Each shift register 402-1, 402-N, 404-1, 404-2, or 404-3 includes a series of shift register cells, which can be implemented as flip-flops or other storage elements that can hold their values until the next selection of the storage elements. The output of one shift register cell in the series can be provided to the input of the next shift register cell to perform data shifting through the shift register.

Input control signals 406 are provided over signal paths 408-1, 408-X, and 408-2 to control shifting of data bits in the shift registers 402-1, 402-N, and 404-1, 404-2, 404-3. The signal paths 408-1, 408-X, and 408-2 can provide signal loading isolation similar to the circuitry discussed above in connection with FIGS. 1, 2, and 3A-3D.

Figure 5:
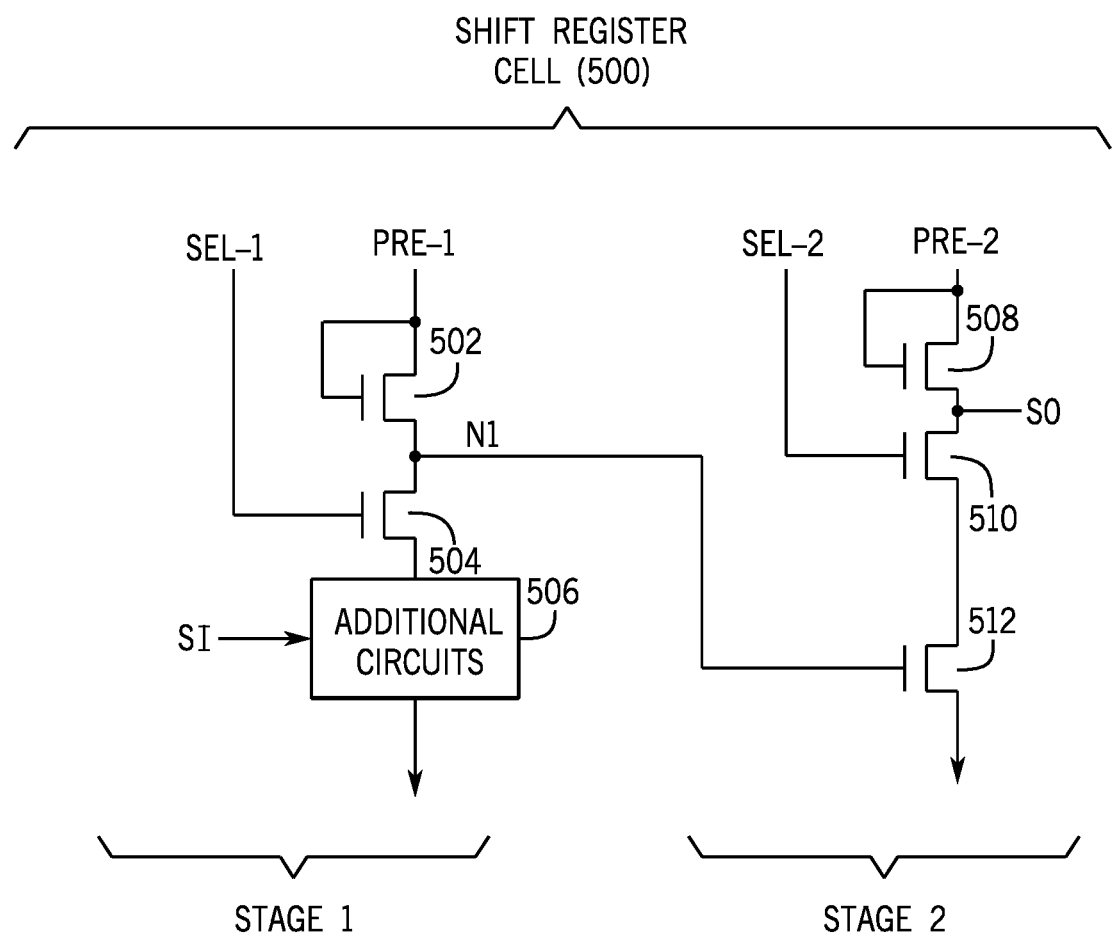
FIG. 5 is a circuit diagram of shift register cell according to some examples.

FIG. 5 shows an example of a shift register cell 500 that can be used in the shift registers of FIG. 4. A number of the shift register cells 500 can be connected in series to form a shift register. The shift register cell 500 includes a first stage and a second stage. In the first stage, a PRE-1 signal is used to precharge an internal node N1 through a transistor 502 in response to the PRE-1 signal being pulsed high. In addition, after the internal node N1 has been precharged by the PRE-1 signal, a select SEL-1 signal is pulsed high to turn on a transistor 504, which causes the node N1 to remain charged or to be discharged, depending upon the state of an input signal SI to additional circuits 506 of the shift register cell 500.

In the second stage, a PRE-2 signal is used to precharge an output node SO through a transistor 508 in response to the PRE-2 signal being pulsed high. After the shift register output SO has been precharged, a select SEL-2 signal can be used to turn on a transistor 510, and the shift register output is either discharged or a maintained charged depending upon the state of the node N1, which controls a transistor 512.

The signals PRE-1, SEL-1, PRE-2, and SEL-2 are examples of the input control signals 406 shown in FIG. 4.

Moreover, in some examples, the input control signal 114 of FIG. 1 or the input control signal 220 of FIG. 2 can be either the SEL-1 signal or SEL-2 signal.

Figure 6:
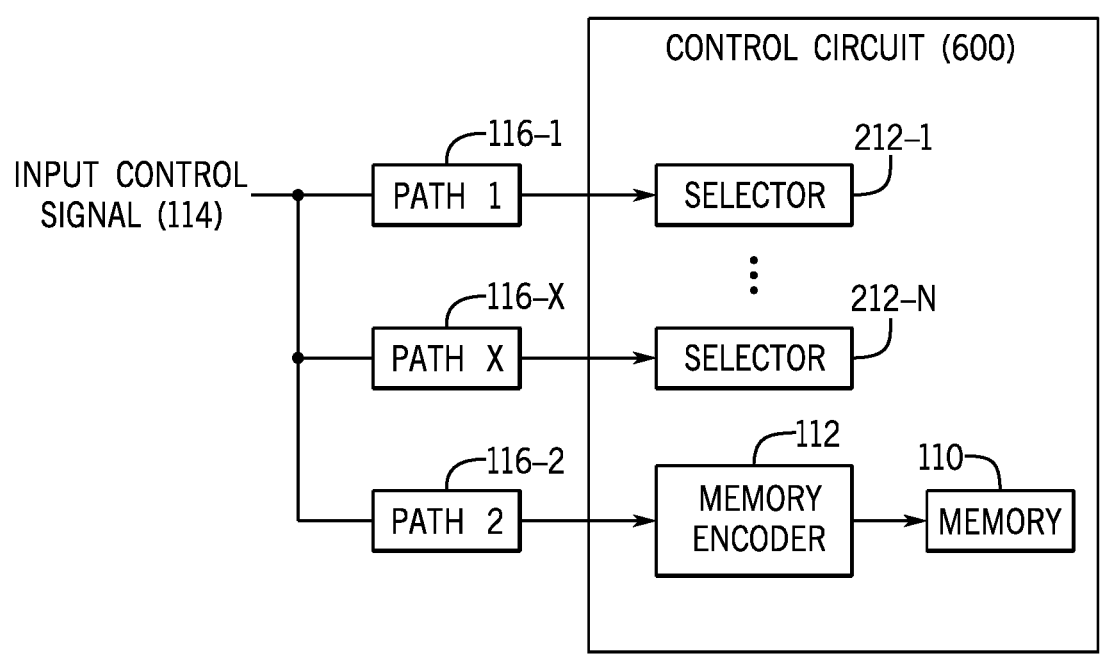
FIG. 6 is a block diagram of a control circuit for a fluid ejection device, according to some examples.

FIG. 6 is a block diagram of an example arrangement that includes a control circuit 600. The control circuit 600 can be part of the controller 104 shown in FIG. 1, the controller 210 shown in FIG. 2, or another control circuit. The control circuit 600 includes selectors 212-1 to 212-N, similar to the selectors of the controller 210 in FIG. 2. In addition, the control circuit 600 includes a memory 110 and a memory encoder 112, similar to the memory 110 in the memory encoder 112 depicted in FIG. 1.

The selectors 212-1 to 212-N are controllable by an input control signal 114 to produce signals for selecting respective nozzles of a fluid ejection device. The first selector 212-1 is responsive to the input control signal 114 propagated over a first signal path 116-1 to turn on a device in the first selector 212-1, and the second selector 212-N is responsive to the input control signal 114 propagated over a signal path 116-X to perform a different task than the turning on a device in the first selector 212-1.

The memory encoder 112 is responsive to the input control signal 114 propagated over a second signal path 116-2 to turn on a device in the memory encoder 112, where signal loading of the second signal path 116-2 is isolated from signal loading of the first signal path 116-1.

Figure 7:
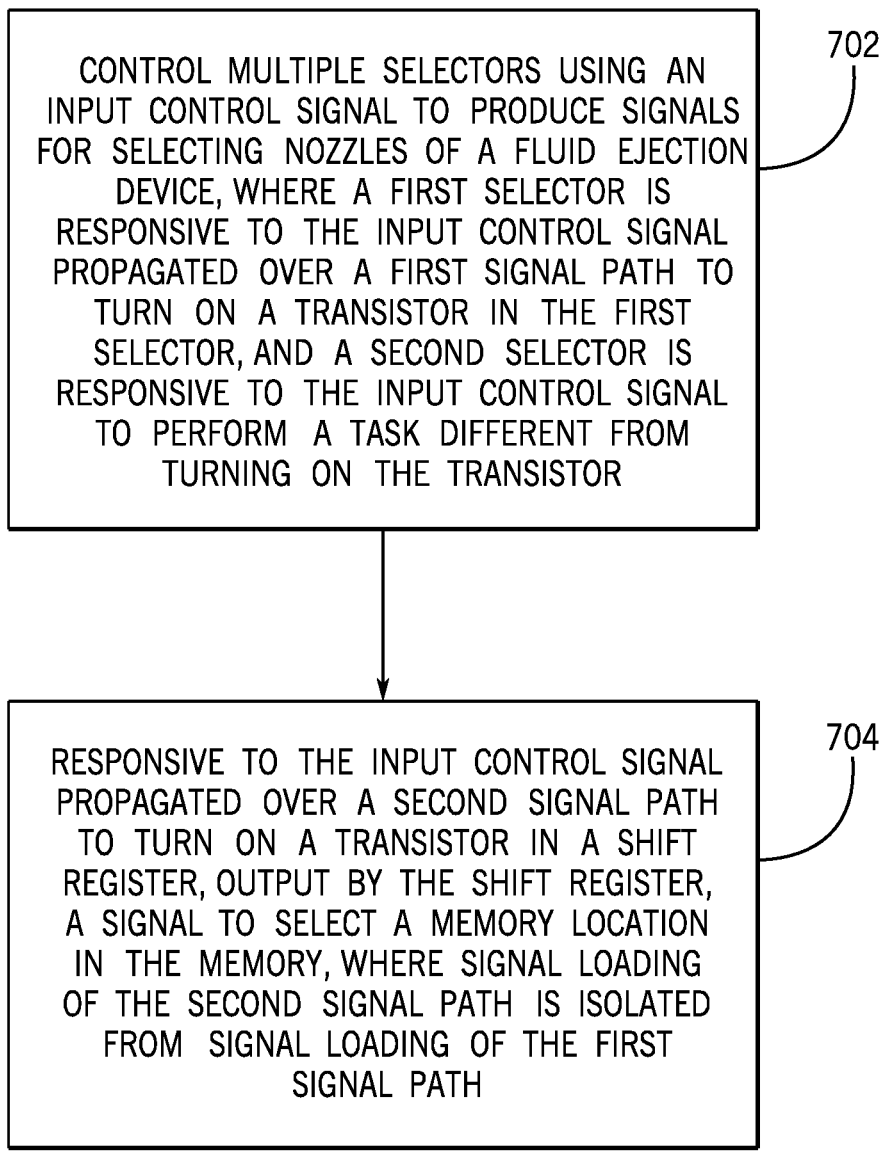
FIG. 7 is a flow diagram of a process according to some examples.

FIG. 7 is a flow diagram of an example process of controlling a fluid ejection device. The process includes controlling (at 702) multiple selectors using an input control signal to produce signals for selecting respective nozzles of the fluid ejection device, where a first selector is responsive to the input control signal propagated over a first signal path to turn on a transistor in the first selector, and a second selector is responsive to the input control signal to perform a task that is different from the turning on of the transistor.

The process further includes, responsive to the input control signal propagated over a second signal path to turn on a transistor in a shift register, outputting (at 704), by the shift register, a signal to select a memory location in the memory, wherein signal loading of the second signal path is isolated from signal loading of the first signal path.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A control apparatus for a fluid ejection device, comprising:
    a plurality of selectors controllable by an input control signal to produce signals for selecting respective nozzles of the fluid ejection device, wherein the plurality of selectors comprises a plurality of address generators to generate addresses for selecting the respective nozzles, a first selector of the plurality of selectors responsive to the input control signal propagated over a first signal path to turn on a device in the first selector, and a second selector of the plurality of selectors responsive to the input control signal to pre-charge a node in a second address generator;
    a memory; and
    a memory encoder to select a memory location in the memory, the memory encoder being responsive to the input control signal propagated over a second signal path to turn on a device in the memory encoder, wherein the input control signal is used to turn on devices in a first address generator and in the memory encoder at substantially the same time, wherein signal loading of the second signal path is isolated from signal loading of the first signal path, wherein signal loading isolation is achieved by providing separate signal paths over which the input control signal is propagated to the selectors and the memory encoder.

2. The control apparatus of claim 1, wherein the device in the first selector turned on responsive to the input control signal comprises a transistor, and wherein the device in the memory encoder turned on responsive to the input control signal comprises a transistor.

3. The control apparatus of claim 1, wherein the first signal path comprises a first voltage divider to output a signal corresponding to the input control signal to the first selector and the second signal path comprises a second voltage divider to output a signal corresponding to the input control signal to the second selector and to the memory encoder.

4. The control apparatus of claim 1, wherein the first signal path comprises a first voltage divider to output a signal corresponding to the input control signal to the first selector, and the second signal path comprises a second voltage divider to output a signal corresponding to the input control signal to the memory encoder.

5. The control apparatus of claim 1, wherein the first signal path comprises a first voltage divider to output a signal corresponding to the input control signal to the first selector and to the memory encoder, and the second signal path comprises a second voltage divider to output a signal corresponding to the input control signal to the second selector and to the memory encoder.

6. The control apparatus of claim 1, wherein the first signal path comprises a first voltage divider to output a signal corresponding to the input control signal to the first selector, and the second signal path comprises a second voltage divider to output a signal corresponding to the input control signal to the memory encoder, the control apparatus further comprising:
a third signal path comprising a third voltage divider to output a signal corresponding to the input control signal to the second selector.

7. The control apparatus of claim 1, wherein the memory encoder comprises a shift register to shift a memory access signal through a plurality of cells of the shift register to output a signal to select the memory location in the memory.

8. The control apparatus of claim 7, wherein the shift register is responsive to the input control signal propagated over the second signal path to turn on a plurality of devices in the shift register.

9. The control apparatus of claim 8, wherein the plurality of devices in the shift register comprises a plurality of transistors that are turned on responsive to the input control signal.

10. A fluid ejection device comprising:
a plurality of nozzles to deliver a fluid during an operation of a system; and
a controller comprising:
a plurality of address generators controllable by an input control signal to produce addresses for selecting respective nozzles of the plurality of nozzles, a first address generator of the plurality of address generators responsive to the input control signal propagated over a first signal path to turn on a device in the first address generator according to a first timing, and a second address generator of the plurality of address generators responsive to the input control signal to perform a task in the second address generator according to a second, different timing, wherein the task comprises at least one of turning on a device and pre-charging a node;
a memory; and
a memory encoder to select a memory location in the memory, the memory encoder responsive to the input control signal propagated over a second signal path to turn on a device in the memory encoder, wherein the input control signal is used to turn on devices in the first address generator and in the memory encoder at substantially the same time, wherein signal loading of the second signal path is isolated from signal loading of the first signal path, wherein signal loading isolation is achieved by providing separate signal paths over which the input control signal is propagated to the address generators and the memory encoder.

11. The fluid ejection device of claim 10, wherein the first signal path comprises a first voltage divider to output a signal corresponding to the input control signal to the first address generator, and the second signal path comprises a second voltage divider to output a signal corresponding to the input control signal to the second address generator.

12. The fluid ejection device of claim 10, comprising a printhead die that comprises the plurality of nozzles and the controller.

13. A method comprising:
controlling a plurality of selectors using an input control signal to produce signals for selecting respective nozzles of a fluid ejection device, a first selector of the plurality of selectors responsive to the input control signal propagated over a first signal path to turn on a transistor in the first selector, and a second selector of the plurality of selectors responsive to the input control signal propagated over a third signal path to turn on a device in the second selector or to pre-charge a node in the second selector; and
responsive to the input control signal propagated over a second signal path to turn on a transistor in a shift register of a memory encoder, outputting, by the shift register, a signal to select a memory location in a memory, wherein the input control signal is used to turn on devices in a first address generator and in the memory encoder at substantially the same time, wherein signal loading of the second signal path is isolated from signal loading of the first signal path, wherein signal loading isolation is achieved by providing separate signal paths over which the input control signal is propagated to the selectors and the memory encoder.

14. The method of claim 13, wherein the second signal path is isolated from the signal loading of the first signal path by use of separate voltage dividers.

* * * * *